United States Patent
Penry

[11] Patent Number: 6,049,094
[45] Date of Patent: Apr. 11, 2000

[54] LOW STRESS PACKAGE ASSEMBLY FOR SILICON-BACKED LIGHT VALVES

[75] Inventor: Matthew D. Penry, Morgan Hill, Calif.

[73] Assignee: National Semiconductor Corporation, Santa Clara, Calif.

[21] Appl. No.: 09/082,900

[22] Filed: May 21, 1998

[51] Int. Cl.[7] .......................... H01L 33/00; H01L 23/495; H01L 23/29
[52] U.S. Cl. ............................ 257/99; 257/100; 257/667; 257/783; 257/788; 257/669
[58] Field of Search ................................. 257/667, 99, 100, 257/687, 710, 731, 774, 783, 788, 787, 669; 349/58; 361/765

[56] References Cited

U.S. PATENT DOCUMENTS

| | | |
|---|---|---|
| 5,386,000 | 1/1995 | Nguyen . |
| 5,399,907 | 3/1995 | Nguyen et al. . |
| 5,468,994 | 11/1995 | Pendse . |
| 5,469,845 | 11/1995 | DeLonzor et al. . |
| 5,489,637 | 2/1996 | Nguyen et al. . |
| 5,489,641 | 2/1996 | Dershem . |
| 5,504,374 | 4/1996 | Oliver et al. . |
| 5,582,772 | 12/1996 | Kwak . |
| 5,583,370 | 12/1996 | Higgins, III et al. . |
| 5,612,403 | 3/1997 | Nguyen et al. . |
| 5,612,513 | 3/1997 | Tuttle et al. . |
| 5,631,191 | 5/1997 | Durand et al. . |

*Primary Examiner*—Minh Loan Tran
*Attorney, Agent, or Firm*—Limbach & Limbach L.L.P.

[57] ABSTRACT

A low-stress silicon-backed light valve package assembly that includes a matched coefficient of thermal expansion (CTE) substrate with a CTE no greater than 300% of the CTE of silicon, a silicon-backed light valve adhered to the matched CTE substrate by a soft adhesive layer, a flexible circuit adhered to the matched CTE substrate and electrically connected to the silicon-backed light valve, an encapsulant dam surrounding the silicon-backed light valve and a soft encapsulant layer filling the cavity defined by the encapsulant dam. Both the soft encapsulant layer and the soft adhesive layer have a Shore A hardness of less than 5. The combination of a soft encapsulant layer, soft adhesive layer and matched CTE substrate insure sufficiently low mechanical stress levels to avoid the presence of optical interference patterns in the light valve display.

15 Claims, 5 Drawing Sheets

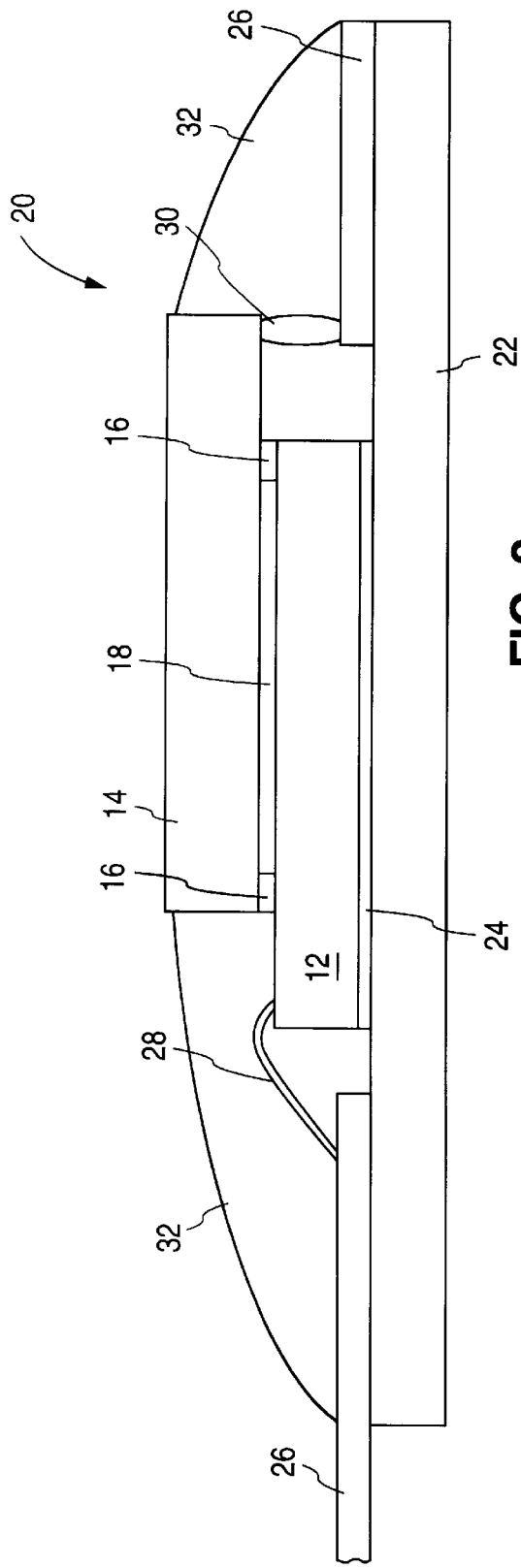
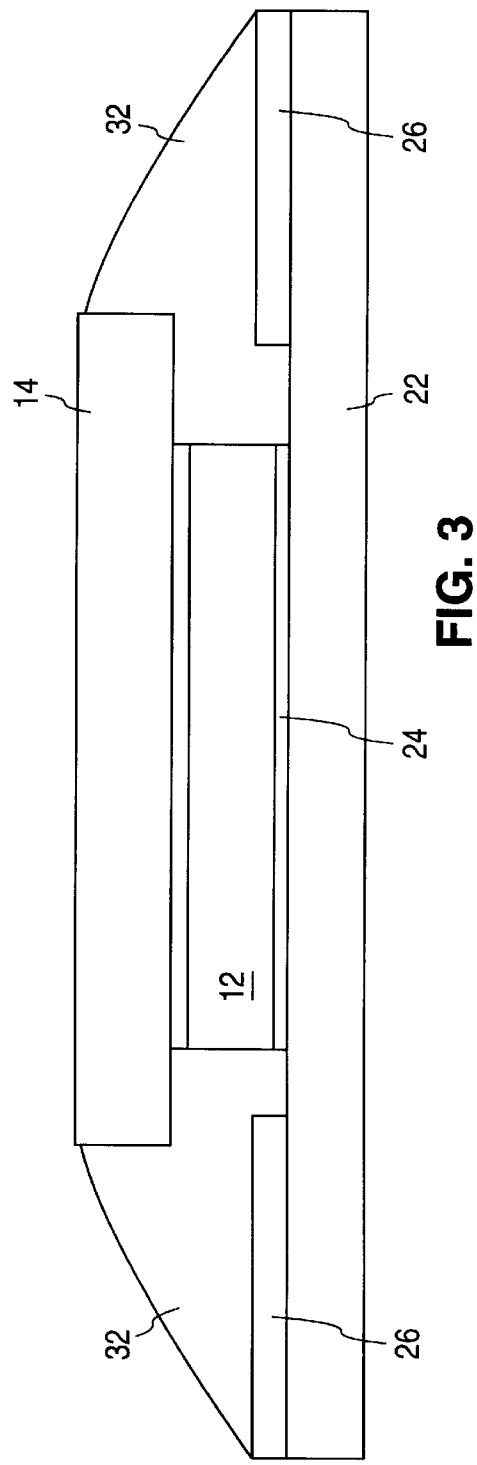

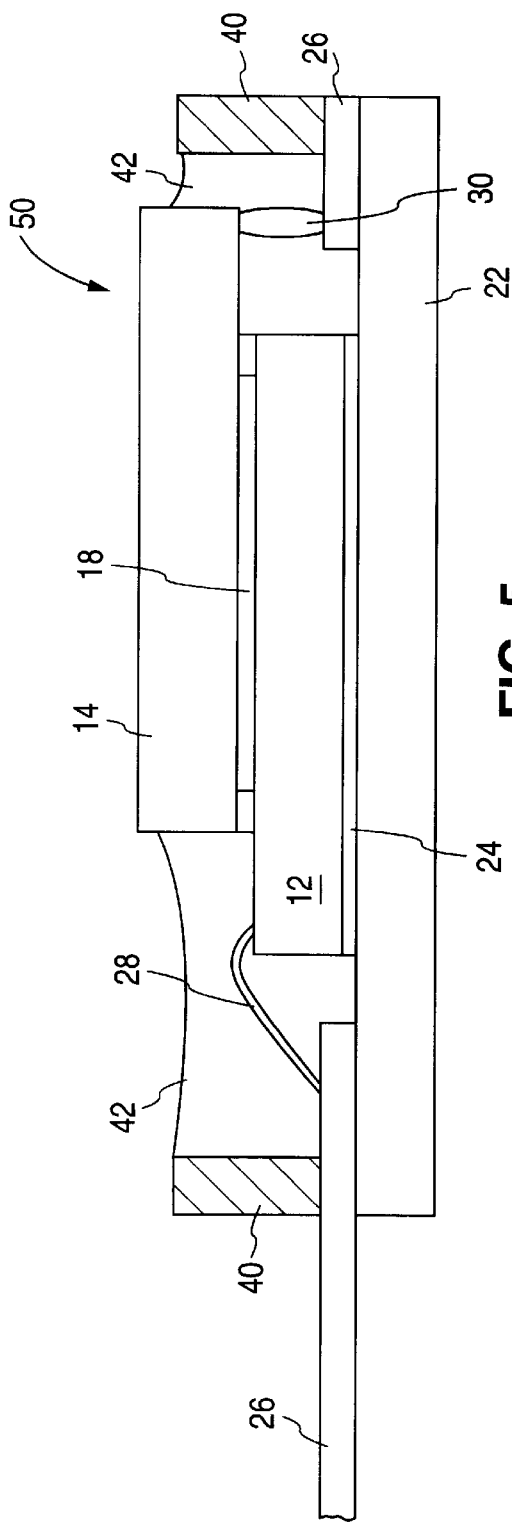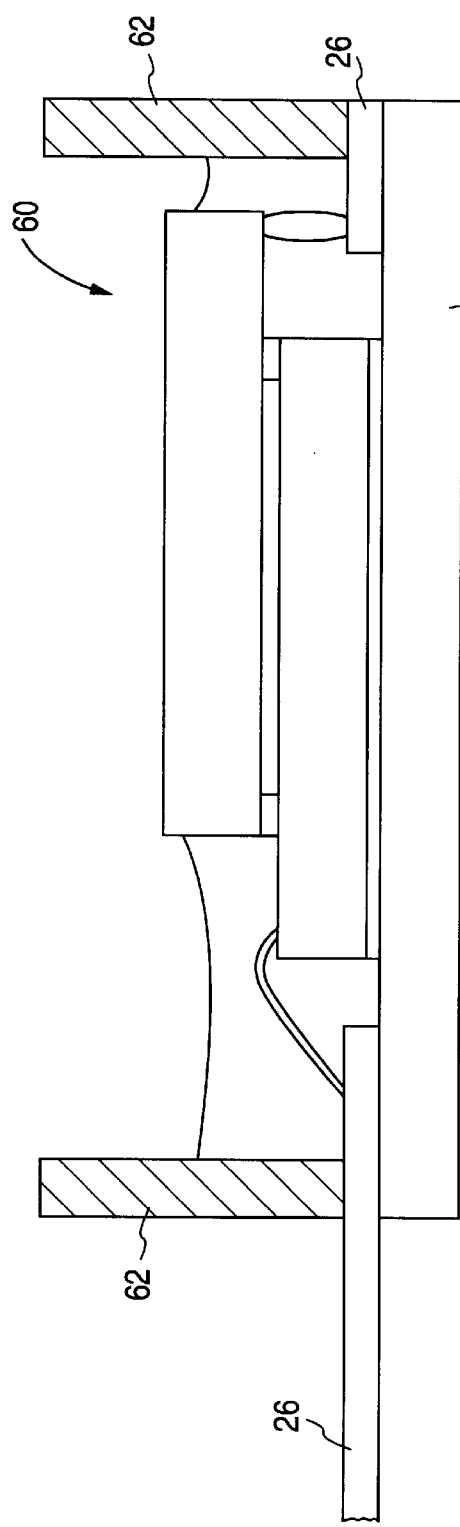

LOW STRESS PACKAGE ASSEMBLY FOR SILICON-BACKED LIGHT VALVES

BACKGROUND OF THE INVENTION

1. Field of the Invention

The present invention relates to packaging of silicon-backed light valves and, in particular, to low-stress, silicon-backed light valve package assemblies and methods of manufacturing the same.

2. Description of the Related Art

Conventional liquid crystal displays (LCDs) include two sheets of glass arranged to form a thin cell which is filled with a liquid crystal material. One of the sheets of glass includes transistors and pixel activation plates on its surface that serve to activate the liquid crystal material at discrete pixel locations.

A silicon-backed light valve is essentially a miniaturized LCD with a silicon backplane substituted for one of the glass sheets. The surface of the silicon backplane includes the transistors (typically CMOS-based), pixel activation plates, and drive circuitry (e.g. row and column drivers) required for operation of the silicon-backed light valve. The pixel activation plates also serve as reflector plates that reflect incoming light back towards a viewer during operation of the light valve.

A representative silicon-backed light valve is shown in cross-section in FIG. 1. Silicon-backed light valve 10 includes a silicon backplane 12 and a glass cover plate 14, which are held in a spaced-apart relationship by precision spacers 16. The thin uniform gap (also referred to as the spacing or LCD cell) formed between the silicon backplane 12 and the glass cover plate 14 is filled with liquid crystal material 18. The combination of silicon backplane 12, liquid crystal material 18 and glass cover plate 14 essentially constitutes a miniature reflective mode, liquid crystal display.

Maintaining a thin uniform gap between the silicon backplane 12 and the glass cover plate 14 (and therefore maintaining a uniform thickness of the liquid crystal material 18) is necessary in avoiding the formation of undesirable optical interference fringe patterns in the display. Such fringe patterns, if visible to a user, render the display unfit for commercial sale.

Typical processes for manufacturing package assemblies for silicon-backed light valves involve first attaching the silicon backplane to a substrate, i.e. either a conventional printed circuit board (PCB) or a PCB that is adhered to a second glass plate, with an adhesive material. After attaching bonding wires between the silicon backplane and the PCB substrate, the bonding wires, portions of the PCB substrate and the silicon backplane are covered by an encapsulant layer to provide mechanical and environmental protection.

A drawback of conventional package assemblies is that the PCB substrate, the adhesive material and the encapsulant layer can all contribute to the exertion of undesirable mechanical stresses on the silicon-backed light valve. The process steps employed in assembling the package (e.g. elevated temperatures during curing of the adhesive material and the encapsulant material) also contribute to the creation of undesirable mechanical stresses. Such mechanical stresses distort the thin uniform gap between the silicon backplane and the glass cover plate resulting in optical interference fringe patterns and rejection of the package assembly. Temperature excursions encountered during use can also lead to mechanical stresses on the light valve and undesirable fringe patterns. Adhering a PCB to a second glass plate in an attempt to provide a substrate that maintains a thin uniform gap is not always successful and incurs additional manufacturing cost.

An additional drawback to the use of an encapsulant layer in siliconbacked light valve package assemblies is the relatively large package size required to accommodate the encapsulant layer. Conventional encapsulation processes rely on dispensing an epoxy encapsulant freely over the bonding wires, peripheral surfaces of the silicon backplane and the PCB substrate. Due to the domed, or convex, shape that the dispensed epoxy encapsulant assumes, the encapsulant layer will naturally spread over a relatively large peripheral area before obtaining a height necessary to completely cover and protect the bonding wires. This spread results in an undesirably large package assembly size.

Once a silicon-backed light valve has been packaged, the entire package assembly must be mounted onto the next-level assembly, for example, a dicroic prism assembly, a metal frame or plastic case of a visual display device, or a sub-assembly of a visual display device. A drawback of conventional silicon-backed light valve package assemblies is the lack of an integral means for mounting the light valve package assembly onto the next-level assembly. Providing additional mounting elements increases cost, package complexity and package size.

Thus, there is a need in the art for a low mechanical stress, cost effective, silicon-backed light valve package assembly, and process for manufacturing the same, that eliminates the formation of user-visible optical interference fringe patterns. The package assembly should also be relatively small in size, cost effective, and provide for mounting into a next-level assembly.

SUMMARY OF THE INVENTION

The present invention provides a low-stress silicon-backed light valve package assembly that eliminates optical interference fringe patterns. The invention also provides a low cost, relatively small silicon-backed light valve package assembly that provides for mounting onto a next level assembly.

The low-stress silicon-backed light valve package assembly according to the present invention includes a matched coefficient of thermal expansion (CTE) substrate with a CTE that is no larger than 300% of the CTE of the silicon backplane. A silicon-backed light valve is bonded to the matched CTE substrate via a soft adhesive layer with a Shore D hardness of less than 5. The low-stress silicon-backed light valve package assembly according to the present invention also includes a soft encapsulant layer, with a Shore D hardness of less than 5, at least partially covering the matched CTE substrate and the silicon-backed light valve. This combination of a matched CTE substrate, soft adhesive layer and equally soft encapsulant layer maintains the mechanical stresses exerted on the silicon-backed light valve sufficiently low so as to prevent distortion of the thin uniform gap, as well as the occurrence of undesirable optical interference fringe patterns.

In one embodiment of the invention, in addition to the use of a matched CTE substrate and soft adhesive layer, a flexible circuit is adhesively bonded to the matched CTE substrate and further electrically connected via bonding wires to the silicon-backed light valve. Since the flexible circuit is not in direct contact with the light valve, this configuration permits the use of flexible circuits, which have relatively large CTEs, as a means for providing input signals to the light valve, while still maintaining the stress exerted on the silicon-backed light valve at a low level. The final configuration also includes an encapsulant dam, which is adhesively attached to the flexible circuit and surrounds the silicon-backed light valve, as well as the soft encapsulant layer. The encapsulant dam is designed to contain the soft encapsulant layer within the bounded area defined by the encapsulant dam. The soft encapsulant layer, therefore, does not spread over an excessive peripheral area of the package assembly and a comparatively small package assembly size can be achieved.

In another embodiment, the encapsulant dam is modified to provide a means for mounting the package assembly onto a next level assembly.

The present invention also provides a process for manufacturing a low-stress, silicon-backed light valve package assembly. A flexible circuit, which includes a plurality of conductive traces adapted for providing input signals to a silicon-backed light valve is first provided. An opening is made in the flexible circuit. Although the opening can be located anywhere in the flexible circuit, a preferred location is at one end of the flexible circuit. A silicon-backed light valve, that includes a silicon backplane with bonding pads, and a matched CTE substrate are also provided.

The flexible circuit is then attached to the matched CTE substrate, with the opening in the flexible circuit defining an exposed portion of the matched CTE substrate. A soft adhesive material (i.e. a precursor to a soft adhesive layer) is then coated on the exposed portion of the matched CTE substrate and the silicon-backed light valve is subsequently positioned on the soft adhesive material. The soft adhesive material is then cured, forming a soft adhesive layer that adheres the silicon-backed light valve to the matched CTE substrate.

Next, bonding wires are connected between the bonding pads of the silicon backplane and the plurality of conductive traces of the flexible circuit. An encapsulant dam is then placed around the silicon-backed light valve and permanently attached to the flexible circuit with an epoxy layer. A sufficient amount of a soft encapsulant material (i.e. a precursor to a soft encapsulant layer) is subsequently dispensed over the flexible circuit, bonding wires and silicon backplane so as to completely cover the bonding wires and exposed portions of the silicon backplane. The soft encapsulant material is then cured, forming a soft encapsulant layer. The process according to the present invention produces a low-stress, silicon-backed light valve package assembly.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings, of which:

FIG. 2 is a cross-sectional side view of a low-stress silicon-backed light valve package assembly according to the present invention.

FIG. 3 is a cross-sectional front view of the silicon-backed light valve package assembly illustrated in FIG. 2.

FIG. 5 is a is a cross-sectional side view of a silicon-backed light valve package assembly according to the present invention that includes an encapsulant dam.

FIG. 6 is a cross-sectional side view of a silicon-backed light valve package assembly according to the present invention that provides for mounting onto the next level assembly.

DETAILED DESCRIPTION OF THE INVENTION

Figure 1:
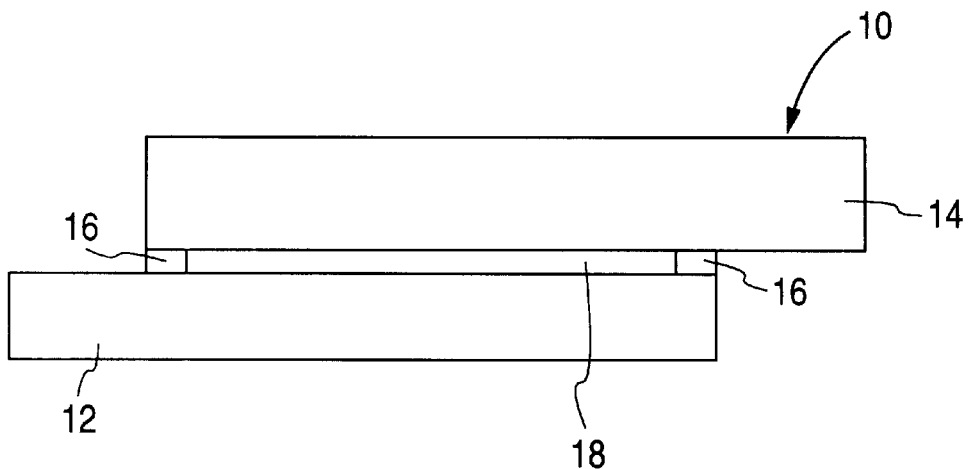
FIG. 1 is a cross-sectional side view of a silicon-backed light valve device.

FIGS. 2 and 3 illustrate an embodiment of a silicon-backed light valve package assembly 20, which includes a silicon backplane 12 that is adhered to a matched coefficient of thermal expansion (CTE) substrate 22 by soft adhesive layer 24. The silicon backplane 12 is also electrically connected to conductive traces of a flexible circuit 26 (typically a polyimide/copper laminate) via at least one bonding wire 28 (typically made of thin metallic wires, such as aluminum/silicon or gold).

The phrase "matched CTE substrate" refers to a substrate with a coefficient of thermal expansion that is no greater than 300% of the thermal coefficient of expansion of the silicon backplane. Silicon has a CTE of approximately 3.0 ppm/°C. Suitable matched CTE substrate materials include alumina ceramic (with a CTE of approximately 7.9 ppm/°C.), alumina nitride (with a CTE of approximately 4.7 ppm/°C.) and mullite, $3Al_2O_3 2SiO_2$ (with a CTE of approximately 4.2 ppm/°C.). In comparison, a typical E-glass and epoxy PCB has a CTE of approximately 12–16 ppm/°C. in the x-y direction and 60–80 ppm/°C. in the z direction.

The phrase "soft adhesive layer" refers to a cured adhesive material layer with a hardness value below 5 on the Shore D scale (i.e. below 50 on the Shore A scale). Suitable adhesive materials are epoxies and silicones, such as those available commercially from Dow and GE. These soft adhesive materials differ from silicon die attach materials conventionally used with flexible circuits, such as Ag-filled epoxies, in that the conventional silicon die attach materials have hardness values of approximately 80 on the Shore D scale.

Flexible circuit 26 is a wiring pattern formed of conductive material traces (such as copper, aluminum or conductive polymer leads) on a thin dielectric (e.g. polyimide or polyester). The flexible circuit can be in a single-sided, double-sided or a multi-layer configuration. Suitable flexible circuits are available from, for example, Sigma Circuits, Santa Clara, Calif.; Dynaflex Technology, San Jose Calif.; Mektek, Fremont, Calif.; Adflex, Phoenix Ariz. and Nitto in Japan. Typical polyimide-based flexible circuits have a CTE of approximately 18–50 ppm/°C., while polyester-based flexible circuits have a CTE of approximately 31 ppm/°C.

As illustrated in FIGS. 2 and 3, the silicon backplane 12 is attached directly to the matched CTE substrate 22 via soft adhesive layer 24. This is accomplished by providing an opening in flexible circuit 26, preferably at one end, such that a portion of the upper surface of the matched CTE substrate 22 remains exposed after that end of the flexible circuit with the opening is overlaid on the matched CTE substrate. This unique configuration provides for the silicon backplane to be directly attached to a matched CTE substrate rather than to a flexible circuit with a CTE that is significantly higher than that of the silicon backplane. Alternatively, a PCB could be substituted for the flexible circuit.

A thin conductive layer of indium-tin-oxide (ITO) of typically 300 angstroms in thickness (not shown) is coated on the lower surface of the glass cover plate 14. The thin conductive layer of ITO coated glass cover plate 14 is connected to flexible circuit 26 via at least one ITO connection 30. ITO connection 30, which is typically fabricated of a conductive epoxy, is designed to provide an electrical bias to the thin conductive layer of ITO during operation of the silicon-back light valve.

Bonding wire 28, exposed peripheral surfaces of the silicon backplane PATENT 12, the exposed upper surface of matched CTE substrate 22 (i.e. the portion of the upper surface of the matched CTE substrate that is not overlaid by either the silicon backplane 12 or flexible circuit 26) and a portion of flexible circuit 26 are completely covered by soft encapsulant layer 32 to provide mechanical and environmental protection.

The phrase "soft encapsulant layer" refers to a cured encapsulant material with a hardness value below 5 on the Shore D scale (i.e. below 50 on the Shore A scale). Suitable encapsulant materials are epoxies and silicones, such as those available commercially from Dow and GE. These soft encapsulant materials differ significantly in hardness from encapsulants conventionally used with flexible circuits that have hardness values of 50–80 on the Shore D scale.

It has been determined that a significant mismatch in CTE between a substrate and a silicon backplane will cause an exertion of undesirable mechanical stresses on the silicon-backed light valve due to differential expansion upon temperature cycling encountered either during the packaging process or use. These stresses are compounded by the presence of a non-compliant adhesive layer between the substrate and the silicon backplane (which acts to transfer stresses from the substrate to the silicon backplane) and the presence of a non-compliant encapsulant layer. These mechanical stresses cause warpage (distortion) of the light valve and the thin uniform gap, and the warpage in turn results in optical interference fringe patterns. However, it has been determined that if (i) the CTE of the substrate is sufficiently matched to that of the silicon backplane, (ii) there is an adequate amount of compliance in the adhesive used to attach the silicon-backed light valve to the substrate, and (iii) there is an ample amount of compliance in the encapsulant material, then mechanical stresses can be maintained below the level that produces optical interference fringe patterns. These criteria are met by the silicon-backed light valve package assembly according to the present invention that includes the combination of a matched CTE substrate, soft adhesive layer and soft encapsulant layer. This unique combination produces a low mechanical stress package assembly that eliminates undesirable warpage and optical interference fringe patterns.

It has also been determined that a silicon-backed light valve, which has a thin precision-spaced uniform LCD gap between the silicon backplane and the glass cover plate, is much more sensitive to mechanical stress than conventional semiconductor devices, such as memory or logic circuits. In the case of semiconductor devices, mechanical stress levels need only be maintained sufficiently low to avoid cracking the silicon. But in the case of silicon-backed light valves, the mechanical stress must be maintained at a lower level since undesirable optical fringe patterns are produced at a level much lower than that required to crack the silicon backplane. However, the silicon-backed light valve package assembly according to the present invention accommodates the stress sensitive nature of silicon-backed light valves by providing the combination of a soft adhesive layer, a soft encapsulant layer and a matched CTE substrate.

Figure 4A:
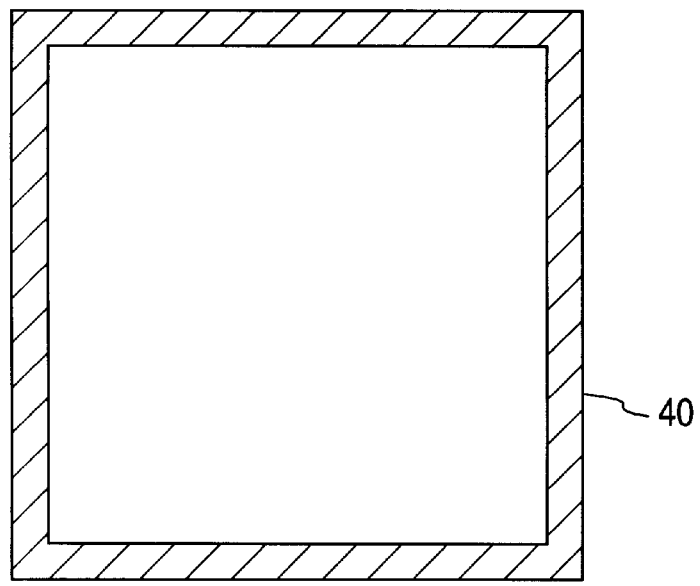
FIGS. 4A and 4B are top and side views, respectively, of an encapsulant dam of the present invention.
Figure 4B:

FIGS. 4A and 4B illustrate an encapsulant dam 40 that is included in one embodiment of the silicon-backed light valve package assembly according to the present invention. Encapsulant dam 40 can be made of, for example, ULTEM material, which can be machined or molded into the desired shape. Acrylonitrile-butadiene-styrene (ABS) class plastics and polycarbonates are also suitable, since they provide for inexpensively molded encapsulant dams. Encapsulant dam 40 is essentially a molded or machined ring that is designed to be affixed on a flexible circuit or a PCB.

FIG. 5 illustrates silicon-backed light valve package assembly 50 that includes an encapsulant dam 40 (equivalent to that shown in FIGS. 4A and 4B). Encapsulant dam 40 is attached to flexible circuit 26 via a layer of epoxy adhesive (not shown in FIG. 5). Encapsulant dam 40 surrounds the silicon-backed light valve and defines a boundary (or cavity) within which encapsulant material will be confined. Encapsulant dam 40, therefore, prevents the encapsulant material from spreading out over the peripheral area of the package assembly while still acquiring sufficient height to completely cover and protect the bonding wires 28. Since encapsulant dam 40 reduces the peripheral area otherwise required to accommodate the soft encapsulant layer, package assembly size is considerably reduced.

A preferred ratio of the encapsulant dam height to its width is 2:1 or greater. This ratio insures that the height of the soft encapsulant layer is sufficient to completely cover the bonding wires while maintaining a relatively small package size. If the ratio of the encapsulant dam height to its width is less than 2:1, then the encapsulant dam itself will occupy a more than necessary proportion of peripheral area.

Figure 7:
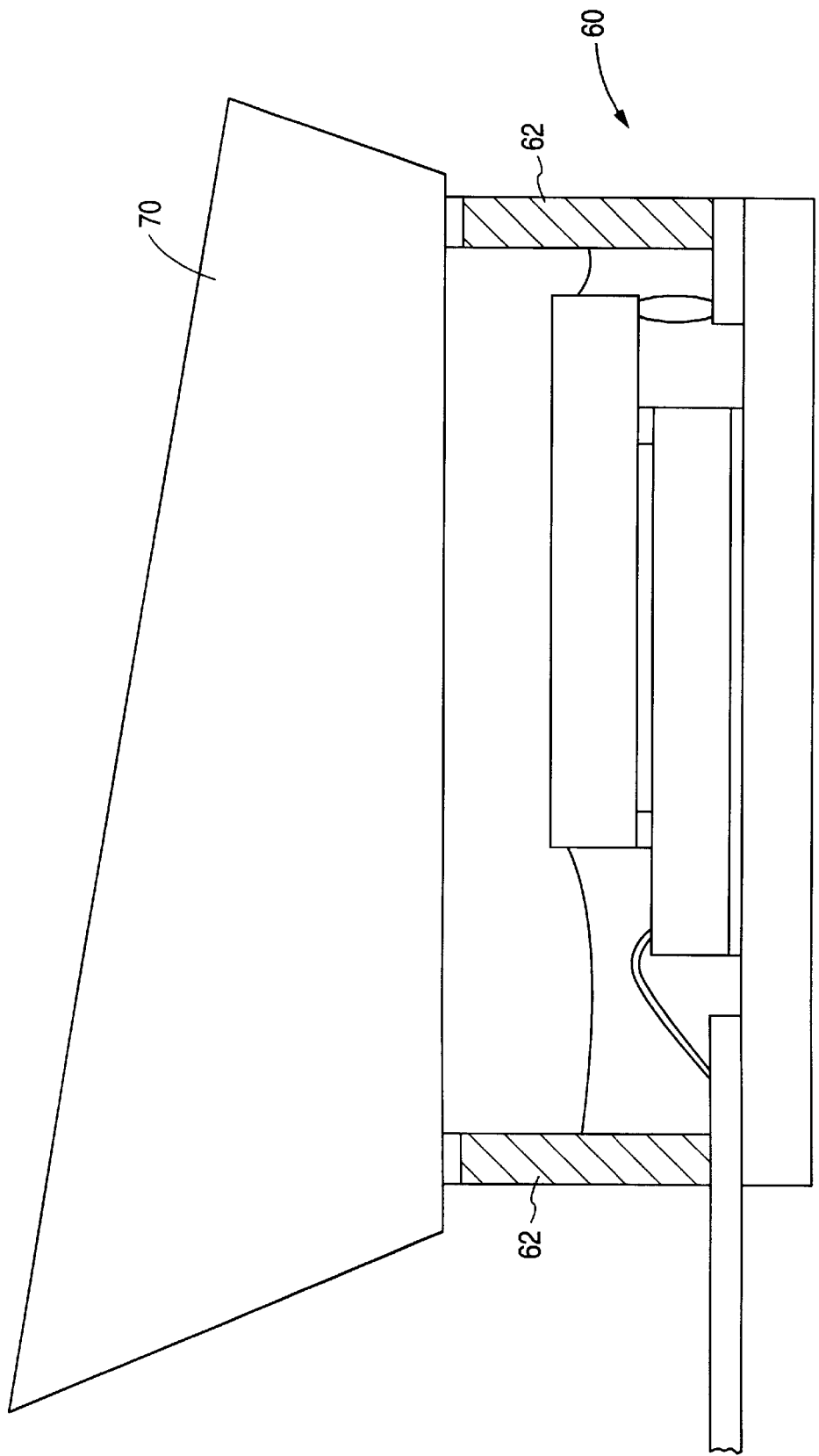
FIG. 7 is a cross-sectional side view of a silicon-backed light valve package assembly according to the present invention mounted onto a next-level assembly prism facet.

FIGS. 6 and 7 illustrate another embodiment of the present invention, in which silicon-backed light valve package assembly 60 includes a combined mounting frame and encapsulant dam 62 that serves as both an encapsulant dam and a mounting frame for mounting the silicon-backed light valve package assembly 60 onto a next-level assembly, such as the prism facet 70 shown in FIG. 7. As shown in FIG. 6, the height of combined mounting frame and encapsulant dam 62 has been increased over that of encapsulant dam 40 in FIG. 5, in order to facilitate its additional function as a next-level assembly mounting frame. Further, the width of combined mounting frame and encapsulant dam 62 can be varied within the aforementioned ratio to provide a larger surface area for adhesive application and bonding to a next-level assembly (see, for example, FIG. 7) while still maintaining a relatively small silicon-backed light valve package assembly. Alternatively, corners of combined mounting frame and encapsulant dam 62 can be "filled in" to provide additional area for bonding to a next-level assembly.

An exemplary silicon-backed package assembly is designed to hold a silicon-backed light valve with a pixel area (0.516 inches wide by 0.641 inches long) and a glass cover plate (0.634 inches wide by 0.797 inches long). This assembly includes an alumina ceramic matched CTE substrate (0.755 inches wide by 1.175 inches long and 0.031 inches in thickness). Attached to the matched CTE substrate is a flexible circuit made of copper and polyimide, containing 40 copper traces. The flexible circuit has an opening (0.634 inches wide by approximately 0.84 inches long), preferably at one end thereof, that is overlaid on the matched CTE substrate. At this end, the width of the flexible circuit is equal to that of the matched CTE substrate (0.755 inches). The width of the flexible circuit is fanned-out to 2.017 inches at the opposite end of the flexible circuit's 20 inch length. The opening of the flexible circuit defines an exposed surface of the matched CTE substrate (as illustrated in FIGS. 2, 3, 5 and 6). The opening is surrounded by a ULTEM encapsulant dam with a width of 0.020 inches and a height of 0.04 inches.

The present invention also provides a process for manufacturing a silicon-backed light valve package assembly. First, a flexible circuit that includes a plurality of conductive traces adapted for providing input signals (for example, the logic signals and voltage required to operate the light valve and form an image) to a silicon-backed light valve is provided. An opening is then made in the flexible circuit, preferably at one end. The flexible circuit is subsequently adhered to a matched CTE substrate in such a way that a portion of the upper surface of the matched CTE substrate is exposed.

Next, a soft adhesive material is applied to the exposed surface of the matched CTE substrate. Then a silicon-backed light valve, that includes a silicon backplane with bonding pads, is provided and positioned on the soft adhesive material. The soft adhesive material is subsequently cured to form a soft adhesive layer. The soft adhesive layer adheres the silicon-backed light valve to the exposed upper surface of the matched CTE substrate.

Figure 8:
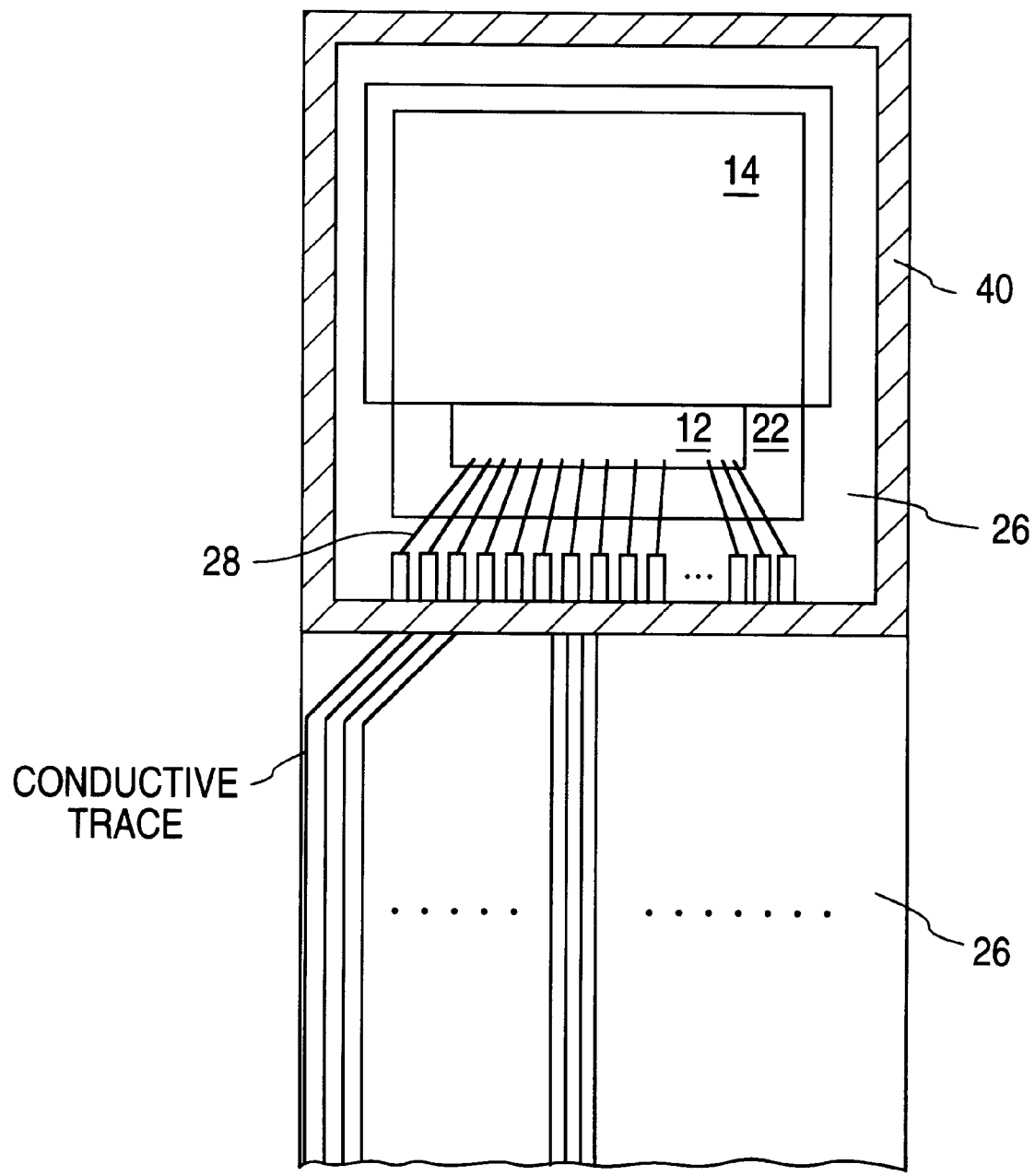
FIG. 8 is a top view of a packaged silicon-backed light valve assembly that includes an encapsulant dam and bonding wires connecting the silicon backplane to conductive traces of a flexible circuit.

Next, bonding wires are connected between the bonding pads on the silicon backplane and conductive traces of the flexible circuit. An encapsulant dam (or combined mounting frame and encapsulant dam) is then provided and affixed to the flexible circuit by using an epoxy adhesive in such a way that it surrounds the silicon-backed light valve. A soft encapsulant material is subsequently dispensed in the area bounded by the encapsulant dam in order to completely cover the bonding wires, the exposed upper surface of the matched CTE substrate, and portions of the flexible circuit and the silicon backplane. Finally, the soft encapsulant material is cured to form a soft encapsulant layer. The resulting silicon-backed light valve assembly is equivalent to that illustrated in FIG. 5 (with the encapsulant dam), FIGS. 6–7 (with the combined mounting frame and encapsulant dam) and FIG. 8 (in which the soft encapsulant layer is not shown).

It should be understood that various alternatives to the embodiments of the invention described herein may be employed in practicing the invention. It is intended that the following claims define the scope of the invention and that methods and structures within the scope of these claims and their equivalents by covered thereby.

What is claimed is:

1. A silicon-backed light valve package assembly comprising:
    a matched coefficient of thermal expansion (CTE) substrate;
    a soft adhesive layer on an upper surface of the matched CTE substrate;
    a silicon-backed light valve attached to the matched CTE substrate by the soft adhesive layer;
    a flexible circuit with an opening, the flexible circuit overlaid on the matched CTE substrate so as to expose the silicon-backed light valve through the opening;
    bonding wires electrically connecting the flexible circuit to the silicon-backed light valve;
    an encapsulant dam attached to the flexible circuit, the encapsulant dam surrounding the silicon-backed light valve and thereby defining a cavity; and
    a soft encapsulant layer disposed in the cavity, the soft encapsulant layer at least partially covering the matched CTE substrate, the flexible circuit and the silicon-backed light valve, and completely covering the bonding wires.

2. The silicon-backed light valve package assembly of claim 1 wherein the opening is located at one end of the flexible circuit.

3. The silicon-backed light valve package assembly of claim 1 wherein the matched CTE substrate is fabricated of alumina ceramic.

4. The silicon-backed light valve package assembly of claim 1 wherein the matched CTE substrate is fabricated of alumina nitride.

5. The silicon-backed light valve package assembly of claim 1 wherein the matched CTE substrate is fabricated of mullite.

6. The silicon-backed light valve package assembly of claim 5 wherein the soft adhesive material is an epoxy.

7. The silicon-backed light valve package assembly of claim 5 wherein the soft adhesive material is a silicone adhesive.

8. The silicon-backed light valve package assembly of claim 1 wherein the soft adhesive layer comprises a soft adhesive material.

9. The silicon-backed light valve package assembly of claim 1 wherein the soft encapsulant layer comprises a soft encapsulant material.

10. The silicon-backed light valve package assembly of claim 8 wherein the soft encapsulant material is an epoxy.

11. The silicon-backed light valve package assembly of claim 8 wherein the soft encapsulant material is a silicone adhesive.

12. A silicon-backed light valve package assembly comprising:
    a matched coefficient of thermal expansion (CTE) substrate;
    a soft adhesive layer on an upper surface of the matched CTE substrate;
    a silicon-backed light valve attached to the matched CTE substrate by the soft adhesive layer;
    a printed circuit board with an opening, the printed circuit board overlaid on the matched CTE substrate so as to expose the silicon-backed light valve through the opening;
    bonding wires electrically connecting the printed circuit board to the silicon-backed light valve;
    an encapsulant dam attached to the printed circuit board, the encapsulant dam surrounding the silicon-backed light valve and thereby defining a cavity; and
    a soft encapsulant layer disposed in the cavity, the soft encapsulant layer at least partially covering the matched CTE substrate, the printed circuit board and the silicon-backed light valve, and completely covering the bonding wires.

13. The silicon-backed light valve package assembly comprising:
    a matched coefficient of thermal expansion (CTE) substrate;
    a soft adhesive layer on an upper surface of the matched CTE substrate;

a silicon-backed light valve attached to the matched CTE substrate by the soft adhesive layer;

a flexible circuit with an opening, the flexible circuit overlaid on the matched CTE substrate so as to expose the silicon-backed light valve through the opening;

bonding wires electrically connecting the flexible circuit to the silicon-backed light valve;

a combined mounting frame and encapsulant dam for providing a means for mounting the silicon-backed light valve package assembly on a next-level assembly, the combined mounting frame and encapsulant dam attached to the flexible circuit, surrounding the silicon-backed light valve and thereby defining a cavity; and a soft encapsulant layer disposed in the cavity, the soft encapsulant layer at least partially covering the matched CTE substrate, the flexible circuit and the silicon-backed light valve, and completely covering the bonding wires.

14. The silicon-backed light valve package assembly of claim 13 wherein the opening is located at one end of the flexible circuit.

15. The silicon-backed light valve package assembly of claim 13 wherein the combined mounting frame and encapsulant dam has a height greater than a height of the silicon-backed light valve.

* * * * *